United States Patent
Kim et al.

(10) Patent No.: US 11,935,588 B2
(45) Date of Patent: Mar. 19, 2024

(54) MEMORY DEVICE, AND METHOD FOR DRIVING MEMORY

(71) Applicant: METACNI CO., LTD., Seoul (KR)

(72) Inventors: Young Seung Kim, Seoul (KR); Seung Moon Yoo, Seongnarn-si (KR); Min Chul Jung, Seoul (KR)

(*) Notice: Subject to any disclaimer, the term of this patent is extended or adjusted under 35 U.S.C. 154(b) by 174 days.

(21) Appl. No.: 17/641,500

(22) PCT Filed: Aug. 25, 2020

(86) PCT No.: PCT/KR2020/011329
§ 371 (c)(1),
(2) Date: Mar. 9, 2022

(87) PCT Pub. No.: WO2021/049777
PCT Pub. Date: Mar. 18, 2021

(65) Prior Publication Data
US 2022/0328095 A1      Oct. 13, 2022

(30) Foreign Application Priority Data

Sep. 9, 2019   (KR) .................... 10-2019-0111715

(51) Int. Cl.
*G11C 11/00* (2006.01)
*G11C 11/419* (2006.01)

(52) U.S. Cl.
CPC ................. *G11C 11/419* (2013.01)

(58) Field of Classification Search
CPC .......................................... G11C 11/419
USPC ....................................................... 365/154
See application file for complete search history.

(56) References Cited

U.S. PATENT DOCUMENTS

| 2006/0158952 | A1 | 7/2006 | Suh | |
| 2011/0116334 | A1* | 5/2011 | Yu | G11C 7/18 365/203 |
| 2013/0173864 | A1* | 7/2013 | Kajigaya | G06F 12/0893 711/144 |
| 2016/0064070 | A1* | 3/2016 | Menezes | G11C 11/419 365/154 |
| 2016/0071577 | A1 | 3/2016 | Menezes | |
| 2019/0035449 | A1* | 1/2019 | Saida | G06N 3/084 |

FOREIGN PATENT DOCUMENTS

| KR | 10-2008-0083431 | 9/2008 |
| KR | 10-2018-0130717 | 12/2018 |

OTHER PUBLICATIONS

English Specification of 10-2018-0130717.
English Specification of 10-2008-0083431.

* cited by examiner

*Primary Examiner* — Hoai V Ho
(74) *Attorney, Agent, or Firm* — ANTONIO HA & U.S. PATENT, LLC (57) ABSTRACT

A memory device according to the present invention may comprise: a memory cell array in which memory cells of a latch structure are connected in matrix form to word lines and bit line pairs composed of bit lines and inverted bit lines; and a driving circuit which, during an ON period in which the word lines activate first memory cells connected to the corresponding word lines, continuously programs or reads n (n is a natural number of 2 or more) second memory cells among the first memory cells through n first bit line pairs.

5 Claims, 10 Drawing Sheets

MEMORY DEVICE, AND METHOD FOR DRIVING MEMORY

CROSS-REFERENCE TO RELATED APPLICATIONS

This application is the National Stage filing under 35 U.S.C. 371 of International Application No. PCT/KR2020/011329, filed on Aug. 25, 2020, which claims the benefit of Korean Application No. 10-2019-0111715 filed on Sep. 9, 2019, the contents of which are all hereby incorporated by reference herein in their entirety.

STATEMENT REGARDING GOVERNMENT-SPONSORED RESEARCH OR DEVELOPMENT

This application is one of the results of Next-generation intelligent semiconductor technology development (design, manufacturing) R&D (Project No. 1415169966 (2020 Apr. 1-2020 Dec. 31), Project Name: Development of integrated display SoC for 8K and 120 Hz high-definition ARVR) hosted by Ministry of Trade, Industry and Energy (MOTIE) and Korea Evaluation Institute of Industrial Technology (KEIT) in Republic of Korea.

TECHNICAL FIELD

The present disclosure relates to a memory device, and more particularly to a device and method for reading or writing a lot of data in a single core operation in an SRAM cell array.

BACKGROUND ART

Memory that stores large-capacity data is broadly classified into volatile memory and non-volatile memory. DRAM and SRAM are volatile memories, and flash memory is non-volatile memory.

Among the volatile memories, the DRAM that stores bit data in capacitors has a simple cell structure and high degree of integration. However, it must periodically refresh cells so that electrons in the capacitors do not leak, so it is difficult to control data input/output.

Figure 1:
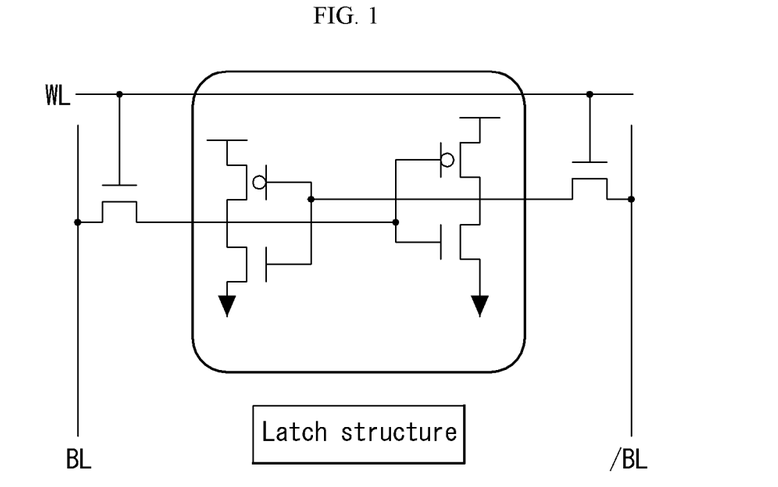
FIG. 1 shows the structure of the memory cell of an SRAM and the connection between a word line and a bit line.

On the other hand, the SRAM, as shown in FIG. 1, stores bit data in a complete latch structure of two pairs of inverters each of which consists of two transistors and which are connected in a symmetrical manner. So, the SRAM has a lower density compared to the DRAM, but has advantages in that data is continuously stored without refresh while power is being supplied and input/output of data is fast.

The characteristics of the DRAM that must be periodically refreshed are not suitable for low-power-oriented mobile devices, and it is not easy to safely manage data stored in the DRAM in a mobile environment. The SRAM is advantageous in the mobile environment from the viewpoint of low power and data stability.

Mobile devices consume a lot of power in a display unit, and the display unit mainly performs simple operations of continuously writing and continuously reading data to be displayed on a panel in the memory of a data driver IC and a timing controller.

DISCLOSURE

Technical Problem

This disclosure has been made in view of this situation, and an object of this disclosure is to provide a method and device for reducing power consumption when continuously writing data to and reading data from the memory cells of the SRAM.

Another object of this disclosure is to provide a method and device for continuously writing data to and continuously reading data from the memory cells of the SRAM.

Yet another object of this disclosure is to provide a method and device for increasing data stability when successively writing data to and reading data from the memory cells of the SRAM.

Technical Solution

According to an embodiment of this disclosure, a memory device may comprise a memory cell array in which memory cells of a latch structure are connected in a matrix form to word lines and bit line pairs each of which comprises a bit line and an inverted bit line; and a driving circuit configured to sequentially program or read n second memory cells among first memory cells connected to a word line through n first bit line pairs (n is a natural number equal to or greater than 2) during an on period in which the word line activates the first memory cells.

According to another embodiment of this disclosure, a memory driving method may comprise activating first memory cells during an on period by outputting a first level to a word line of a memory cell array comprising memory cells of a latch structure, and inactivating the first memory cells during an off period by outputting a second level to the word line; sequentially programming or reading n second memory cells among the first memory cells through n first bit line pairs (n is a natural number equal to or greater than 2) during the on period; and precharging the n first bit line pairs during the off period.

Advantageous Effects

Therefore, according to the embodiments of this disclosure, by continuously writing data to or reading data from the plurality of cells constituting a page through a plurality of bit line pairs during a period in which the word lines are on, the number of on/off operations of the word lines is reduced, thereby reducing power consumption.

In addition, by performing the developing, precharging, and equalizing operations of the bit lines related to corresponding page data only once while performing the writing/reading operations of the page data, it is possible to reduce power consumption and data input/output time.

BEST MODE

Various embodiments of the memory device and the method of driving a memory of this disclosure will be simply and clearly described as follows.

The memory device according to an embodiment may comprise a memory cell array in which memory cells of a latch structure are connected in a matrix form to word lines and bit line pairs each of which comprises a bit line and an inverted bit line; and a driving circuit configured to sequentially program or read n second memory cells among first memory cells connected to a word line through n first bit line pairs (n is a natural number equal to or greater than 2) during an on period in which the word line activates the first memory cells.

In an embodiment, the on period may comprise a first period during which the first bit line pairs are developed, and n second periods during which the second memory cells are sequentially programmed or read after the first period.

In an embodiment, the driving circuit may comprise a compensation circuit connected to the bit line and the inverted bit line of each of the first bit line pairs, in order to maintain voltage levels of the bit line and the inverted bit line of each of the first bit line pairs during the n second periods.

In an embodiment, the compensation circuit may comprise a first to third PMOS transistors. During the n second periods, the first PMOS transistor may output a first supply voltage same as a supply voltage supplied to the memory cells. And, in each of the second and third PMOS transistors, an input electrode may be connected to an output electrode of the first PMOS transistor, a control electrode and an output electrode may be respectively connected to the bit line and the inverted bit line or the inverted bit line and the bit line.

In an embodiment, the driving circuit may comprise a precharging circuit to charge the bit line and the inverted bit line of a corresponding bit line pair during an off period inactivating the first memory cells with a second voltage lower than a supply voltage supplied to the memory cells.

In an embodiment, the precharging circuit may convert the supply voltage to the second voltage through 2 NMOS transistors during the off period.

In an embodiment, the precharging circuit may comprise first and second NMOS transistors and a PMOS transistor. In the first and second NMOS transistors, input electrodes may receive the supply voltage, control electrodes may be connected to each other and receive a turn-on logic level during the off period, and output electrodes may be respectively connected to one and the other of the bit line and the inverted bit line. And, the PMOS transistor may be turned on during the off period to connect the output electrodes of the first and second NMOS transistors to each other.

In an embodiment, the precharging circuit may comprise fourth and fifth PMOS transistors, a sixth PMOS transistor, and first and second NMOS transistors. In the fourth and fifth PMOS transistors, input electrodes may receive the supply voltage, and control electrodes may be connected to each other and receive a turn-on logic level during the off period. In the sixth PMOS transistor, a control electrode may be connected to the control electrode of the fifth PMOS transistor, and input and output electrodes may be respectively connected to one and the other of output electrodes of fourth and fifth PMOS transistors. And, in the first and second NMOS transistors, input electrodes may be respectively connected to one and the other of the input and output electrodes of the sixth PMOS transistor, control electrodes may receive the turn-on logic level during the off period, and output electrodes may be respectively connected to one and the other of the bit line and the inverted bit line.

In an embodiment, the driving circuit may divide the n first bit line pairs into k groups and precharge the n first bit line pairs in a group unit, while precharging respective groups at different timings during an off period inactivating the n first memory cells.

The memory driving method according to another embodiment may comprise activating first memory cells during an on period by outputting a first level to a word line of a memory cell array comprising memory cells of a latch structure, and inactivating the first memory cells during an off period by outputting a second level to the word line; sequentially programming or reading n second memory cells among the first memory cells through n first bit line pairs (n is a natural number equal to or greater than 2) during the on period; and precharging the n first bit line pairs during the off period.

In an embodiment, the on period may comprise a first period during which the first bit line pairs are developed, and n second periods during which the second memory cells are sequentially programmed or read after the first period.

In an embodiment, the method may further comprise maintaining voltage levels of the bit line and the inverted bit line of each of the first bit line pairs during the n second periods using a compensation circuit connected to the bit line and the inverted bit line of each of the first bit line pairs.

In an embodiment, the precharging of the n first bit line pairs during the off period may precharge the bit line and the inverted bit line of the first bit line pair during the off period with a second voltage lower than a supply voltage supplied to the memory cells.

In an embodiment, the precharging of the n first bit line pairs during the off period may divide the n first bit line pairs into k groups and precharge respective groups in a group unit at different timings during the off period.

MODE FOR INVENTION

Hereinafter, preferred embodiments of the memory device and the method of driving a memory according to this disclosure will be described in detail with reference to the accompanying drawings.

Like reference numbers throughout the specification refer to substantially the same elements. In the following description, if it is determined that a detailed description of a known function or configuration related to this disclosure may unnecessarily obscure the gist of this disclosure, the detailed description thereof will be omitted.

FIG. 1 shows the structure of the memory cell of an SRAM and the connection between a word line and a bit line.

The memory cell of the SRAM is composed of 6 MOS-FETs in FIG. 1, and may also be composed of 4 MOSFETs and a resistor.

A flip-flop in which two inverters, in which a PMOS connected to a first supply voltage and an NMOS transistor connected to a second supply voltage lower than the first supply voltage are connected in series, are connected to each other forms a latch structure. Each of two MOSFETs is attached to each side of the flip-flop and the two MOSFETs are connected to a word line WL and a bit line BL or a word line WL and an inverted bit line /BL.

While the word line WL maintains a high logic level, the latch structure memory cell is connected to a bit line pair consisting of a bit line BL and an inverted bit line /BL, it is possible to write bit data to or read bit data from the memory cell.

When bit data 1 is applied to the bit line BL and bit data 0 is applied to the inverted bit line /BL, bit data 1 is stored in the memory cell in an infinitely-looped manner in the flip-flop, and conversely when bit data 0 and 1 are applied to the bit line BL and the inverted bit line /BL respectively, bit data 0 is stored in the memory cell in the infinitely-looped manner. So, bit data is stored in the memory cell without refreshing as long as power is supplied.

Figure 2:
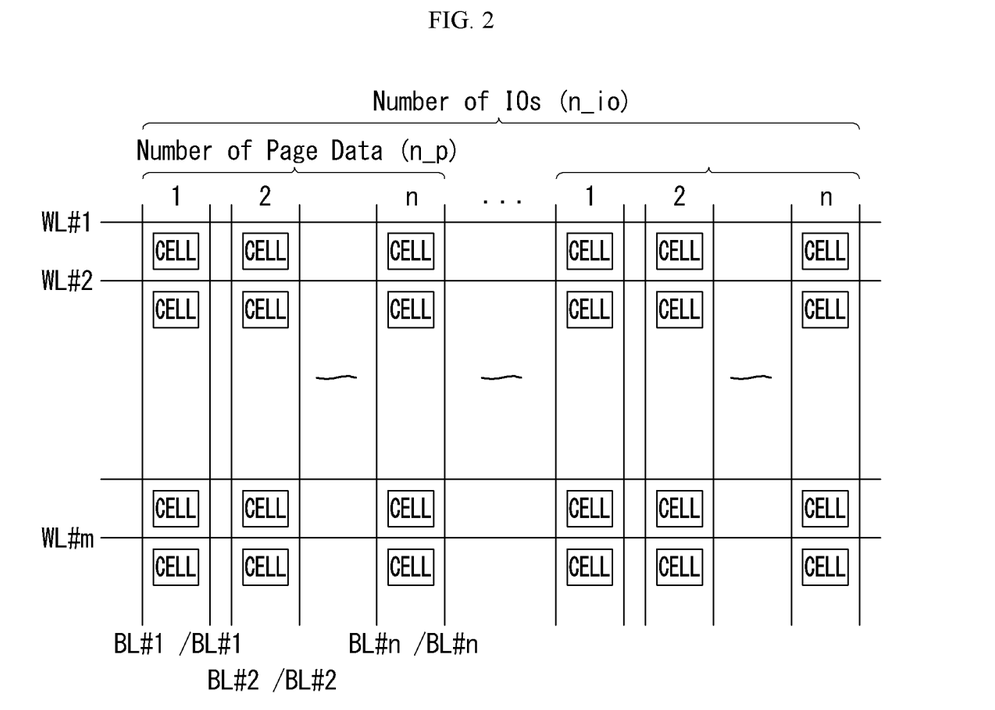
FIG. 2 shows the data input/output unit of an SRAM memory cell array.

FIG. 2 shows the data input/output unit of an SRAM memory cell array.

Data read/write operations of the memory cell array are performed in units of pages. In FIG. 2, one page consists of data stored in n memory cells, that is, n bits. In other words, the number of data (page data) constituting a page is n_p (n_p=n).

For example, among the memory cells in the first row connected to the first word line WL #1, first, data read/write operations are sequentially performed on the first to nth bit line pairs (BL #1 to BL #n), and then data read/write operations are sequentially performed on the (n+1)th to (2n)th bit line pairs BL #(n+1) to BL #(2n).

And, when reading data from the memory cell array, after a memory device reads all the data of a predetermined number of pages and storing all the data in a buffer while temporarily storing the data read from the memory cell array in page units in the buffer, the memory device can output the data stored in the buffer to another device connected to the memory device.

At this time, the number of pages storing data in the buffer corresponds to the input/output unit or the number of input/output n_io, and the input/output unit is determined by the size of the data bus that inputs and outputs data from and to the outside. If the data bus has a size of 1 byte, the input/output unit is 8, and if the data bus has a size of 2 bytes, the input/output unit is 16.

Figure 3:
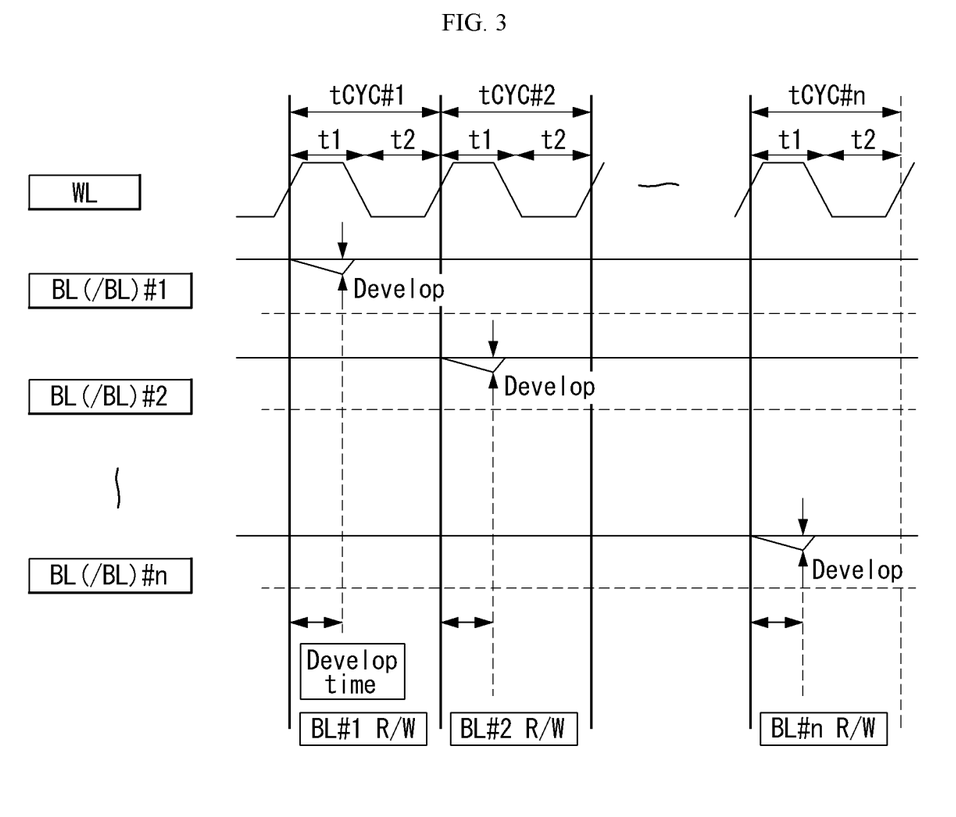
FIG. 3 shows a general SRAM read timing.

FIG. 3 shows a general SRAM read timing, and a SRAM write timing is the same as in FIG. 3. In an SRAM write operation, instead a bit line pair is charged/discharged or developed with data stored in the memory cell, a write driving circuit charges/discharges the bit line pair to store the data in the latch of the memory cell.

When reading data from the memory cell array in a page unit composed of n data, the memory device reads data from one memory cell at every cycle tCYC corresponding to a requested data rate.

During one cycle tCYC, the word line successively outputs an enable level and a disable level, so that memory cells connected to the word line are connected to a corresponding bit line pair (activated) and then disconnected (inactivated).

During a first period t1 (or the ON period of the word line) in which the word line outputs the enable level in a first cycle tCYC #1, a first memory cell connected to the corresponding word line is connected to a first bit line pair BL #1. So, the bit line and the inverted bit line of the first bit line pair BL #1 are charged and discharged with the data bit pair stored in the first memory cell, respectively (Develop), and a sense amplifier (not shown) connected to the first bit line pair BL #1 amplifies a potential difference between the bit line and the inverted bit line of the first bit line pair BL #1.

During a second period t2 (or the OFF period of the word line) in which the word line outputs the disable level in the first cycle tCYC #1, the first memory cell and the first bit line pair BL #1 are disconnected. During this period, a signal amplified by the sense amplifier (not shown) connected to the first bit line pair BL #1 may be determined as first memory cell data and stored in a buffer (not shown) (BL #1 R/W).

During a first period t1 in which the word line outputs the enable level in a second cycle tCYC #2, a second memory cell connected to the corresponding word line is connected to a second bit line pair BL #2. So, the bit line and the inverted bit line of the second bit line pair BL #2 are charged and discharged with the data bit pair stored in the second memory cell, respectively (Develop), and a sense amplifier (not shown) connected to the second bit line pair BL #2 amplifies a potential difference between the bit line and the inverted bit line of the second bit line pair BL #2.

During a second period t2 in which the word line outputs the disable level in the second cycle tCYC #2, the second memory cell and the second bit line pair BL #2 are disconnected. During this period, a signal amplified by the sense amplifier (not shown) connected to the second bit line pair BL #2 may be determined as second memory cell data and stored in a buffer (not shown) (BL #2 R/W).

Similarly, during an n-th cycle tCYC #n, an n-th memory cell is activated so that the bit line and the inverted bit line of the n-th bit line pair are charged and discharged with the data bit pair stored in the n-th memory cell respectively (Develop), and a sense amplifier (not shown) connected to the n-th bit line pair BL #n amplifies the potential difference between the bit line and the inverted bit line of the n-th bit line pair BL #n to determine n-th memory cell data, and outputs the nth memory cell data to a buffer (not shown) (BL #n R/W).

As described above, data of one memory cell may be determined through a corresponding bit line pair for each cycle (consisting of a word line on period and an off period in which the word line successively outputs an enable level and a disable level) and stored in a buffer.

Since the operation of reading data successively is done in units of pages, in order to read the data stored in the memory cell array or write data to the memory cell array, during the number of cycles tCYC corresponding to the number of data (n or n_p) constituting the page, the word line repeats the on/off switching operation within each cycle. So, power is inevitably consumed in the operation of switching the word line on/off.

In order to reduce power consumption, it is necessary to reduce the operation of switching the word line on/off.

A minimum time is required to sequentially turn on/off the word line, and during the on period t1 of the word line a development time is required for charging and discharging the data pair of the memory cell corresponding to the bit line BL and the inverted bit line /BL of a bit line pair. So, it is not easy to reduce the time during which the word line is turned on in order to increase the read/write speed of data.

In addition, since the bit line BL and the inverted bit line /BL must be equalized with each other and pre-charged after the word line is turned off, equalizing and precharging times are required each time the word line is turned off.

As described above, it is difficult to increase a speed in the process of reading or writing data in the memory cell array of the conventional SRAM, and a method for increasing the speed is required.

The embodiments of this disclosure recognizes this situation and necessity, and performs the on/off switching operation of the word line only once while reading data from the plurality of memory cells of the memory array, for example the number of memory cells corresponding to one page data (or while writing data to the memory cells) based on the characteristics that the SRAM memory cell holds data in a latch structure. So the number of on/off switching operations of the word line and power consumption may be reduced.

In addition, by performing the charging/discharging (or developing) operation and the precharging and equalizing operation for each bit line pair only once while writing or reading data of one page amount, a memory device devices may reduce power consumption and increase the speed of writing or reading data to/from memory cells.

Figure 4:
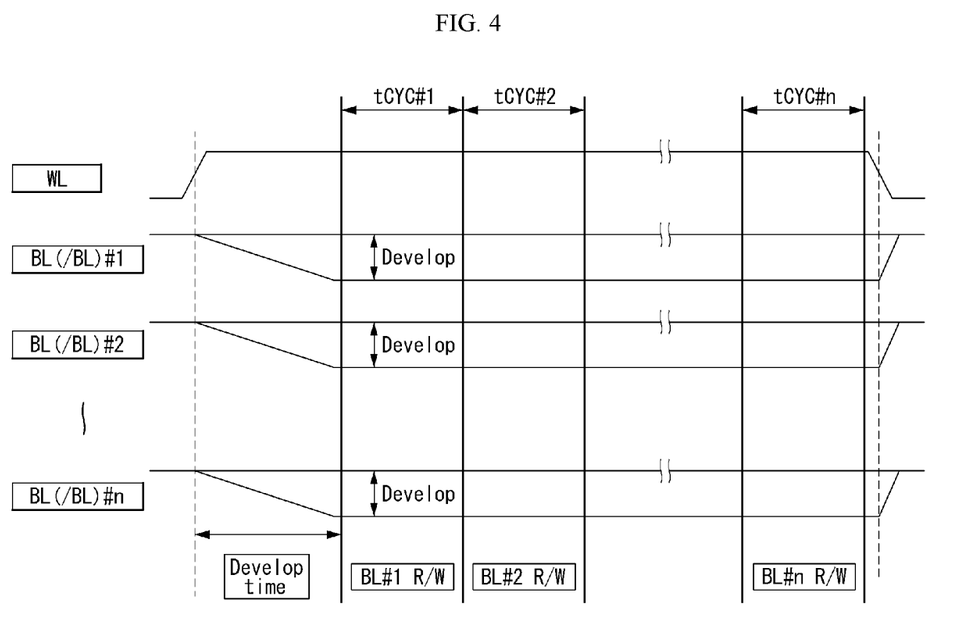
FIG. 4 shows the SRAM read timing according to an embodiment of this disclosure, FIG. 5 schematically shows the functional blocks of a memory device according to an embodiment of this disclosure.

FIG. 4 shows the SRAM read timing according to an embodiment of this disclosure.

In FIG. 3 corresponding to the conventional read timing, the word line on/off switching operation, which changes the output of the word line WL from the off level to the on level and then again changes the output of the word line WL from the on level to the off level, occurs once every cycle tCYC corresponding to a requested data rate. So, the on/off switching operation of the word line is performed n times during n cycles of reading n data corresponding to one page.

However, in the embodiment according to this disclosure, as shown in FIG. 4, n cycles are performed while reading n data corresponding to one page, but the on/off switching operation of the word line is performed only once.

The period during which the word line maintains the on level (or the on period of the word line) includes the charge/discharge (developing) period (Develop time) in which a bit line pair is simultaneously charged and discharged with data of a connected memory cell and the period (BL #1 R/W~BL #n R/W) in which n cycles, in which the sense amplifier amplifies the potential difference of the connected bit line pair and outputs it to the buffer, sequentially proceed.

During the period in which the word line maintains the off level (or the off period of the word line), the equalizing and precharging operations for bit line pairs are performed.

Accordingly, in the on/off switching operation of the word line, the on period of the word line is maintained longer than the off period.

Before the word line is switched from the off level to the on level, the equalizing and precharging operations are performed on the n bit line pairs connected to the n memory cells corresponding to the page data of which is requested in the next on period of the word line, and the corresponding bit line pairs are charged and discharged with a precharging voltage.

When the word line is switched from the off level to the on level and becomes the on period, first the n bit line pairs charged with the precharging voltage are connected to the corresponding memory cells, and have the development time in which each of the n bit line pairs is charged and discharged from the precharging voltage by the data bit pair stored in a corresponding memory cell.

After the development time in which the bit line pairs are sufficiently charged and discharged by the data bit pairs has elapsed, a data write/read operation BL R/W for sensing, amplifying and outputting the data bit charged in each bit line pair is sequentially performed.

During a first cycle tCYC #1, the first sense amplifier (not shown) connected to a first pair of bit lines amplifies the potential difference between the bit line BL and the inverted bit line /BL of the first bit line pair to determine the data bit stored in the first memory cell connected to the first bit line pair, and outputs the determined data bit to a buffer (not shown) (BL #1 R/W).

During the second cycle tCYC #2 following the first cycle tCYC #1, the second sense amplifier (not shown) connected to a second pair of bit lines amplifies the potential difference between the bit line BL and the inverted bit line /BL of the second bit line pair to determine the data bit stored in the second memory cell connected to the second bit line pair, and outputs the determined data bit to a buffer (not shown) (BL #2 R/W).

By repeating this operation until the n-th cycle tCYC #n, the data bit stored in the n-th memory cell connected to the n-th bit line pair is output to a buffer (not shown) (BL #n R/W).

In this way, n data bits constituting one page may be stored in the buffer by performing n cycles.

After the n-th cycle (tCYC #n) ends, the word line is switched from the on level to the off level, and the on period of the word line is ended.

The on period of the word line may be calculated as a sum of a value obtained by multiplying a period of one cycle tCYC by n and a developing period (Develop time). And, one cycle period can be set corresponding to a requested data rate, and the developing period is an almost fixed value. Accordingly, the length of the ON period of the word line may be determined by the number of data bits constituting one page and a requested data rate.

As described above, current consumption may be reduced by performing the word line switching operation only once while writing one page of data, and it is possible to further reduce current consumption by reducing the number of times equalizing and precharging operations are performed.

Figure 5:
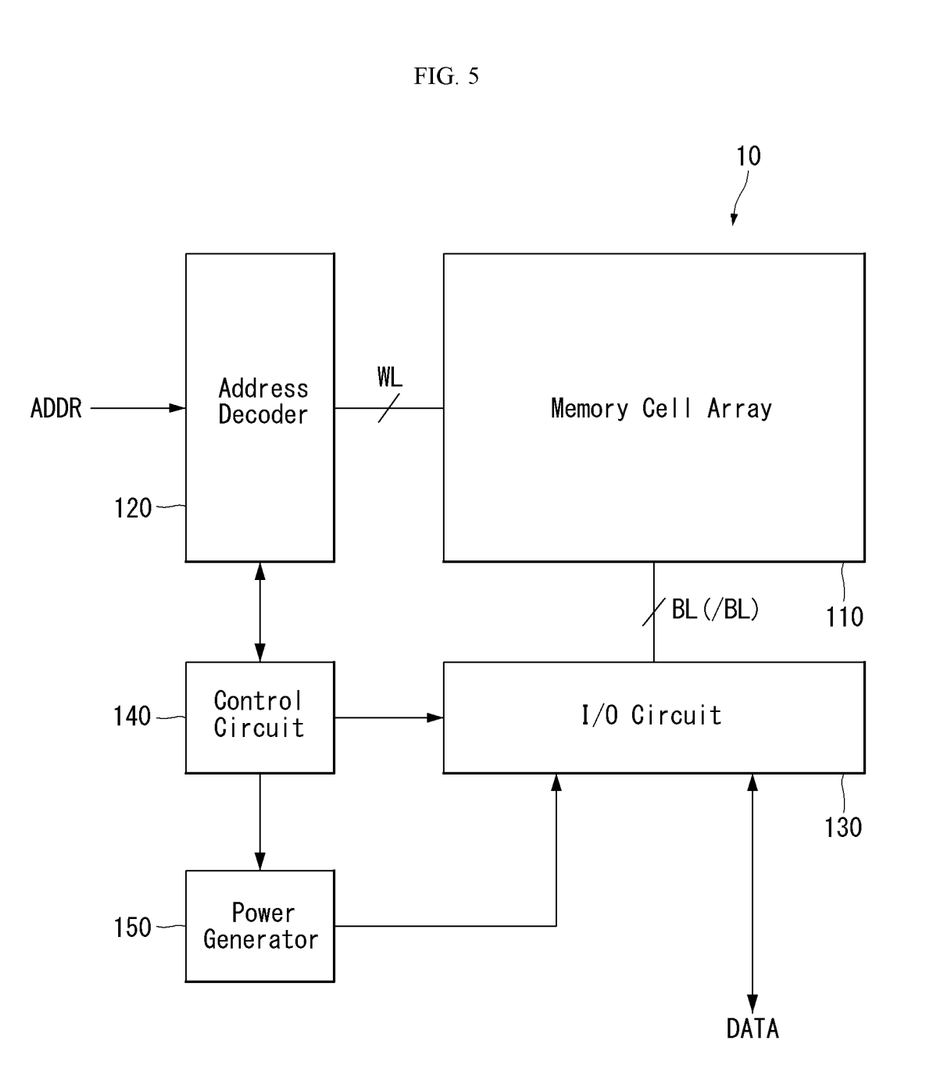

FIG. 5 schematically shows the functional blocks of a memory device according to an embodiment of this disclosure.

The memory device 10 according to this disclosure may comprise a memory cell array 110 composed of SRAM memory cells and a driving circuit configured to drive the memory cell array 110. The driving circuit may include an address decoder 120, an input/output circuit 130, a control circuit 140, and a power generator 150.

The address decoder 120 is configured to receive an address ADDR, to be connected to the memory cell array 110 through word lines WL, and to drive the word lines WL under the control of the control circuit 140.

The address decoder 120 decodes a received address ADDR and selects a word line WL to be driven based thereon. Since data read/write operations are performed in units of pages, the address decoder 120 may transmit signals or information indicating the bit line pairs BL/BL included in the requested address ADDR to the input/output circuit 130 and/or the control circuit 140 so that the input/output circuit 130 can select corresponding bit line pairs.

The input/output circuit 130 receives or outputs data DATA to be written or read from/to the memory cell array 110, connects the bit line pairs BL/BL selected by the information provided by the address decoder 120 to the memory cell array 110, and performs the operation of writing or reading data to/from the memory cell array 110 under the control of the control circuit 140.

The input/output circuit 130 may comprise the data read circuit including the sense amplifier that detects and amplifies the data bit charged to a bit line pair, the data write circuit for charging bit line pairs with data bits to be written to the memory cell, and the circuit configuration for equalizing and precharging the bit line pairs BL/BL.

The control circuit 140 is connected to the address decoder 120, the input/output circuit 130, and the power generator 150, and is configured to control the operation of the memory device 10, that is the operation of writing or reading data to/from the memory cell array 110.

The power generation unit 150 is configured to generate a plurality of voltages necessary for the operations of the memory cell array 110, the address decoder 120, the input/output circuit 130 and the control circuit 140 by using an external voltage supplied to the memory device 10. The power generation unit 150 generates and supplies first/second power voltages, a precharging voltage, word line on/off voltages, and the like.

When driving the word line WL to read or write n data of the requested page, the address decoder 120 may perform the on/off switching operation of the corresponding word line WL only once, and maintains the ON period of the word line by the sum of a developing period for charging and discharging n bit line pairs and n cycle periods for driving respective bit line pairs.

The input/output circuit 130 identifies n bit line pairs belonging to the page requested to be written or read based on the information provided by the address decoder 120, and performs the equalizing and precharging operations on the identified bit line pairs to charge both the bit line BL and the inverted bit line /BL of the bit line pairs to a precharging voltage, before the address decoder 120 selects the word line.

Also, when the word line WL corresponding to the requested page is selected and becomes an on level, the input/output circuit 130 charges/discharges the corresponding bit line pairs with the data bits of the memory cells connected to the selected word line WL during the development time.

During the first cycle tCYC #1 to the nth cycle tCYC #n after the development time has elapsed, the input/output circuit 130 sequentially performs the operations of writing or reading data to/from n memory cells from the first bit line pair BL #1 to the nth bit line pair BL #n (BL #1 R/W~BL #n R/W) by using a data reading circuit including a sense amplifier or a data writing circuit. For each cycle, the input/output circuit 130 may amplify the potential difference between the bit line and the inverted bit line of a corresponding bit line pair and output it to the buffer (corresponding to data read operation), or may charge/discharge the bit line and the inverted bit line of the corresponding bit line pair with the data bit stored in a buffer to write the memory cell connected thereto as the corresponding data bit (corresponding to data write operation).

The control circuit 140 may provide a control signal for adjusting the on period and the off period of the word line WL to the address decoder 120, and also may also provide to the input/output circuit 13 the control signals for adjusting the timing of each cycle during which the precharging operation, the developing operation, and the data read/write operation is performed.

Meanwhile, when data is continuously written or read from/to n memory cells constituting a page in one word line-on period (in consideration of the convenience of writing the specification, writing data to the memory cell can be expressed simply as programming the memory cell, and reading data from the memory cell can be expressed simply as reading the memory cell), there are things to consider.

First is that the ON period of the word line becomes longer, and the next is that all bit line pairs related to data write or read pages are developed to a logic level since the developing period is set sufficiently long.

Figure 6:
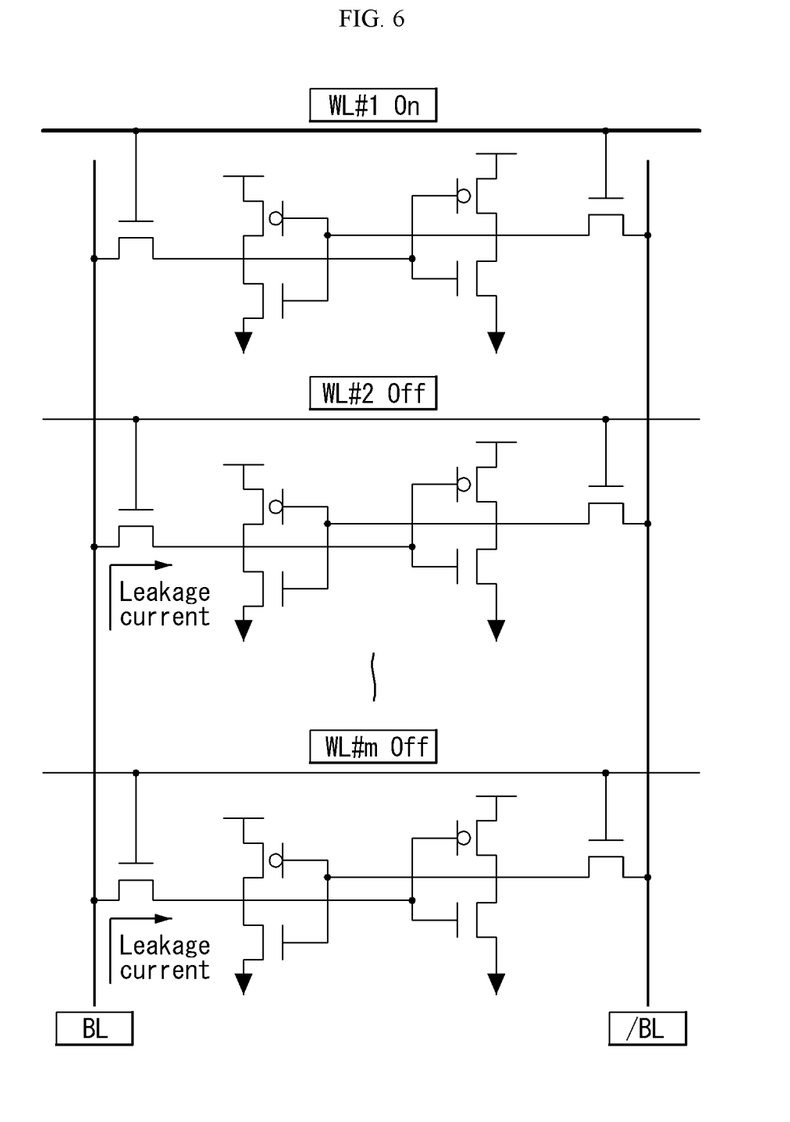
FIG. 6 shows the phenomenon in which the potential level of a bit line is lowered by a leakage current.

FIG. 6 shows the phenomenon in which the potential level of a bit line is lowered by a leakage current.

In FIG. 6, the first word line WL #1 is selected and enabled (WL #1 On), and the first memory cell connected to the first word line WL #1 is activated and connected to the bit line pair (BL, /BL). The remaining second to mth word lines WL #2 to WL #m are disabled without being selected, so that the remaining memory cells (second to mth memory cells) are not connected to the bit line pair BL and /BL and are inactivated.

As the data bit stored in the first memory cell is charged and discharged to the bit line BL and the inverted bit line /BL, a potential difference occurs between the bit line BL and the inverted bit line /BL, and a sense amplifier (not shown) senses this potential difference and amplifies it to determine the data bit of the memory cell.

The second to mth memory cells connected to the disabled second to mth word lines WL #2 to WL #m are inactivated and not connected to the line pair BL and /BL. However, a leakage current flows into the inactivated memory cell from the bit line or the inverted bit line, so that the voltage levels of the bit line BL and the inverted bit line /BL are lowered. In particular, the leakage current occurs well when the bit line or the inverted bit line is a voltage corresponding to a high logic and an inactive memory cell stores a low logic.

When the leakage current flows to the inactivated memory cell, the potential difference between the bit line and the inverted bit line becomes small, which slows down the sensing speed of the sense amplifier and may cause an error in the detection of a data bit due to noise.

In particular, when the on period of the word line is lengthened according to an embodiment of this disclosure, the current leaks and the amount by which the level of the bit line or inverted bit line drops becomes large, so bit detection errors are more likely to occur.

One embodiment of this disclosure provides a leakage current compensation circuit to the bit line pair, so that a voltage drop does not occur in the bit line pair developed according to the data bit of the corresponding memory cell due to the leakage current and the developed voltage maintains its level during the on period of the word line.

The leakage current compensation circuit may operate during the cycle period of writing or reading data after a developing period (Develop time) among the on period of the word line. In addition, the leakage current compensation circuit may not operate during the period of equalizing and precharging the bit line pair.

Figure 7:
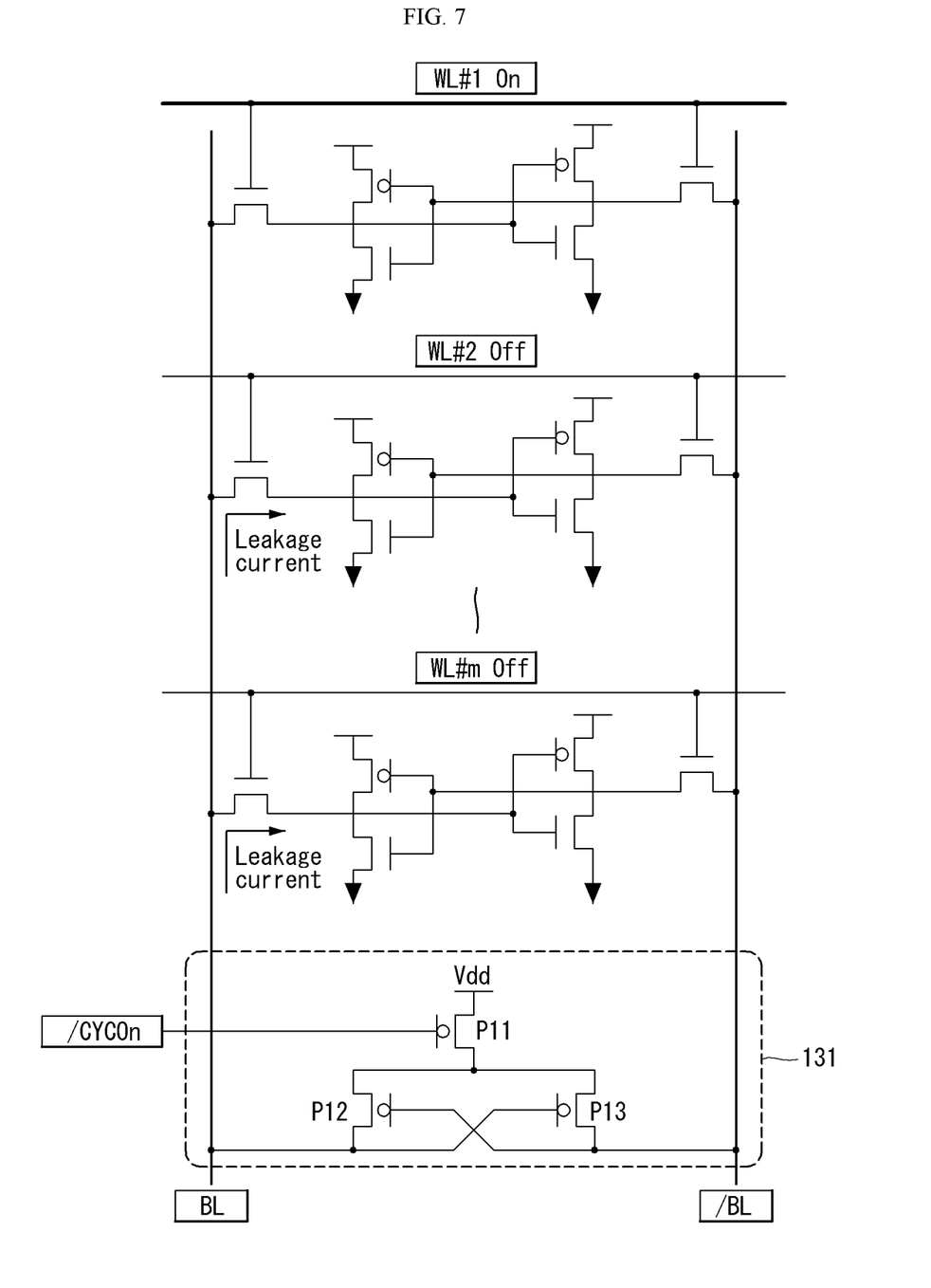
FIG. 7 shows a leakage current compensation circuit connected to a bit line pair according to an embodiment of this disclosure, FIG. 8 compares the levels at which a bit line pair is developed in a conventional driving method and the driving method of this disclosure.

FIG. 7 shows a leakage current compensation circuit connected to a bit line pair according to an embodiment of this disclosure.

The leakage current compensation circuit 131 may be composed of three PMOS transistors and connected to the bit line BL and the inverted bit line /BL.

A first PMOS transistor P11 has a gate electrode connected to a first signal line for supplying the control signal (cycle-on signal) /CYCOn for controlling the operation of the leakage current compensation circuit 131. A first electrode of the first PMOS transistor P11 is connected to a first power voltage Vdd, and a second electrode of the first PMOS transistor P11 is connected to first electrodes of second and third PMOS transistors P12 and P13.

The cycle-on signal /CYCOn may be of a logic high level to turn off the first PMOS transistor P11 during the off-period of the word line and the developing period among the on period of the word line and be of a logic low level to trun on the first PMOS transistor P11 during n cycle periods among the on period of the word line.

The cycle-on signal /CYCOn may be provided to the input/output circuit 130 by the control circuit 140 or generated by the input/output circuit 130 based on the timing signal supplied by the control circuit 140.

In the second PMOS transistor P12, a gate electrode is connected to the inverted bit line /BL, a first electrode is connected to the second electrode of the first PMOS transistor P11, and a second electrode is connected to the bit line BL.

In the third PMOS transistor P13, a gate electrode is connected to the bit line BL, a first electrode is connected to the second electrode of the first PMOS transistor P11, and a second electrode is connected to the inverted bit line /BL.

The first PMOS transistor P11 supplies the first power voltage Vdd corresponding to the logic high level (data bit 1) to the second/third PMOS transistors P12/P13 during n cycle periods. The second/third PMOS transistors P12/P13 receive the first power supply voltage Vdd to the first electrodes, which are input electrodes, and connect the gate electrodes, which are control electrodes, to one and the other of the bit line and the inverted bit line and the second electrodes, which are output electrodes, oppositely to their own control electrodes, respectively.

The first power voltage Vdd may be the same as the voltage supplied to the memory cell. The first electrodes and the second electrodes of the PMOS transistors may be a source electrode and a drain electrode.

The leakage current compensation circuit 131 may operate only while programming or reading the memory cell, that is, while the cycle-on signal /CYCOn is at a logic low level, and when the cycle-on signal /CYCOn is at the logic low level the second electrode of the first PMOS transistor P11 (the first electrodes of the second/third PMOS transistors P12/P13) becomes the first power voltage Vdd.

If the bit line BL and the inverted bit line /BL are developed to a logic high level and a logic low level respectively by the data bit of the memory cell during the development time, during a cycle period, the logic low level of the inverted bit line /BL turns on the second PMOS transistor P12 so that the second electrode of the second PMOS transistor P12, that is the bit line BL becomes the first power voltage Vdd to maintain the logic high level, and the logic high level of the bit line BL turns off the third PMOS transistor P13 so that the second electrode of the third PMOS transistor P13, that is the inverted bit line /BL maintains the logic low level.

Similarly when the bit line BL and the inverted bit line /BL are developed to the logic low level and the logic high level respectively, the logic levels of the bit line BL and the inverted bit line /BL are maintained by the leakage current compensation circuit 131.

Therefore, even though the on-period of the word line becomes longer and a leakage current occurs in the bit line and the inverted bit line, the bit line and the inverted bit line maintain two logic levels of the first power voltage Vdd and the second power voltage as they are.

Figure 8:
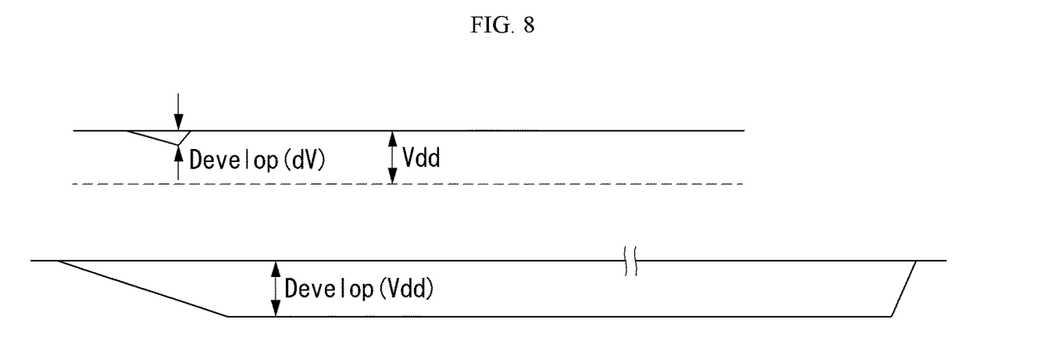

FIG. 8 compares the levels at which a bit line pair is developed in a conventional driving method and the driving method of this disclosure.

Conventionally, bit line pairs are developed only during the period when the word line is on during the cycle period of programming or reading the memory cell, so the voltage magnitude by which the voltages of the bit line and the inverted bit line change from a precharging voltage by developing is small (Develop dV).

On the other hand, for a sufficiently long developing period (Develop time) after the word line becomes on, the bit line pair is developed into a first power supply voltage Vdd and a second power supply voltage according to the data bit of a connected memory cell, so the potential difference between the bit line and the inverted bit line becomes large (Develop Vdd).

If the potential difference between the bit line and the inverted bit line becomes large, it becomes easier to detect the potential difference between the two bit lines in a sense amplifier, whereas when the program or read operation of the memory cell is completed, the word line becomes off and the operation of equalizing and precharging the bit line pair is to be done, the charging amount for the bit line pair increases.

In addition, the number of memory cells corresponding to the page is successively programmed or read during the period when the word line is on and n bit line pairs corresponding to a page must be equalized and precharged simultaneously during the period when the word line is off, so the number of bit line pairs to be precharged at the same time increases.

Figure 9:
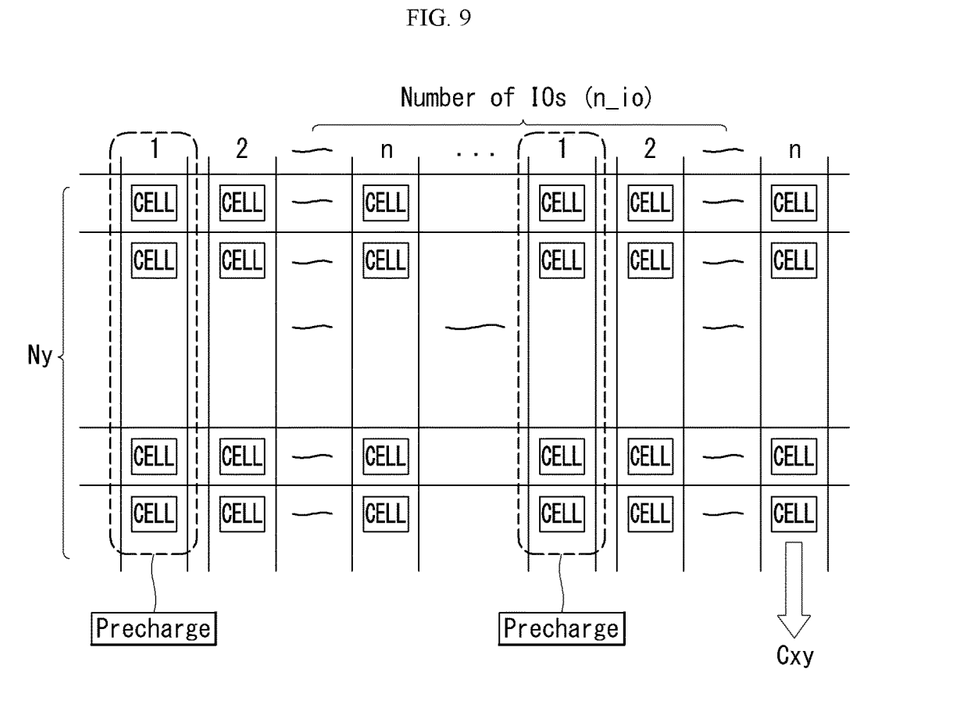
FIG. 9 shows the columns of memory cells to be precharged in the conventional driving method.
Figure 10:
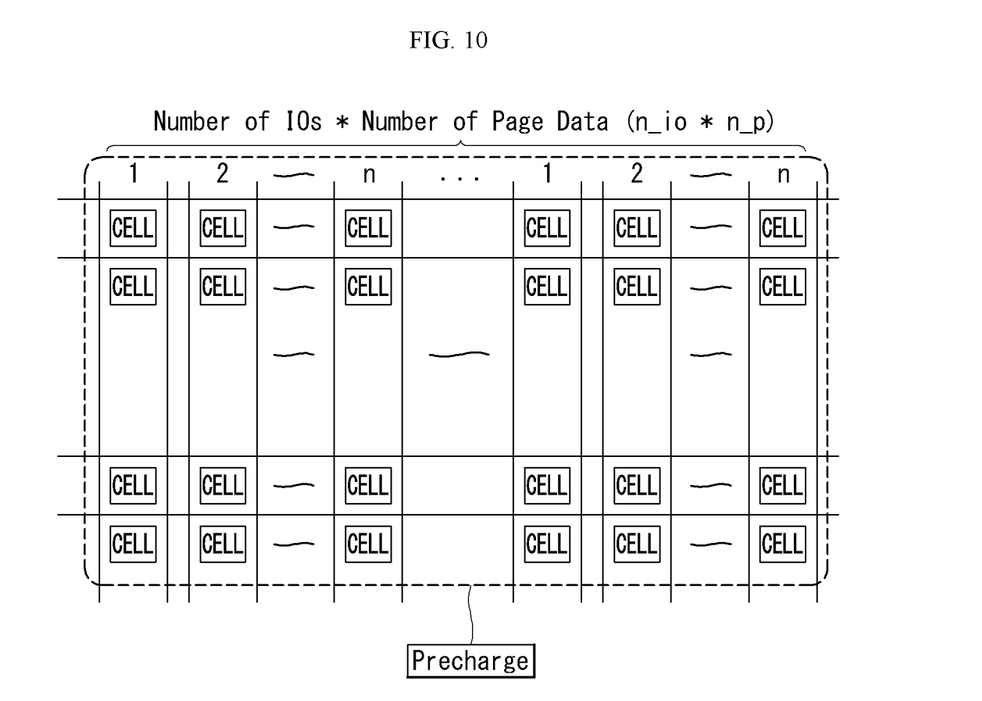
FIG. 10 shows the columns of memory cells to be precharged in the driving method of this disclosure.

FIG. 9 shows the columns of memory cells to be precharged in the conventional driving method, and FIG. 10 shows the columns of memory cells to be precharged in the driving method of this disclosure.

In FIG. 9, when Ny is the number of memory cells connected to the bit line, Cxy is the parasitic capacitance that one memory cell forms with the bit line, n_io is the number of input/output, and dV is the developing voltage level of the bit line or the inverted bit line, the amount of precharging charge in the conventional driving method becomes $Q=Ny*Cxy*n\_io*dV$.

In FIG. 10, when Vdd is the developing voltage level of the bit line or inverted bit line and n_p is the number of data constituting a page, the amount of precharging charge becomes $Q=Ny*Cxy*n\_io*Vdd*n\_p$ in the embodiment of this disclosure, so that the amount of charge and discharge of the embodiment of this disclosure is increased by $n\_p*(Vdd/dV)$ times compared to the prior art.

When a larger current flows than a conventional case during precharging, a peak current increases, and then if the capacity of a current supply becomes insufficient, the current supply is not smooth and the precharging operation cannot be performed properly. So, reliability issues may also arise from the excessive peak current.

The embodiment of this disclosure may adjust a precharging level or perform the precharging operation in stages by grouping bit line pairs, in consideration of this problem.

Figure 11:
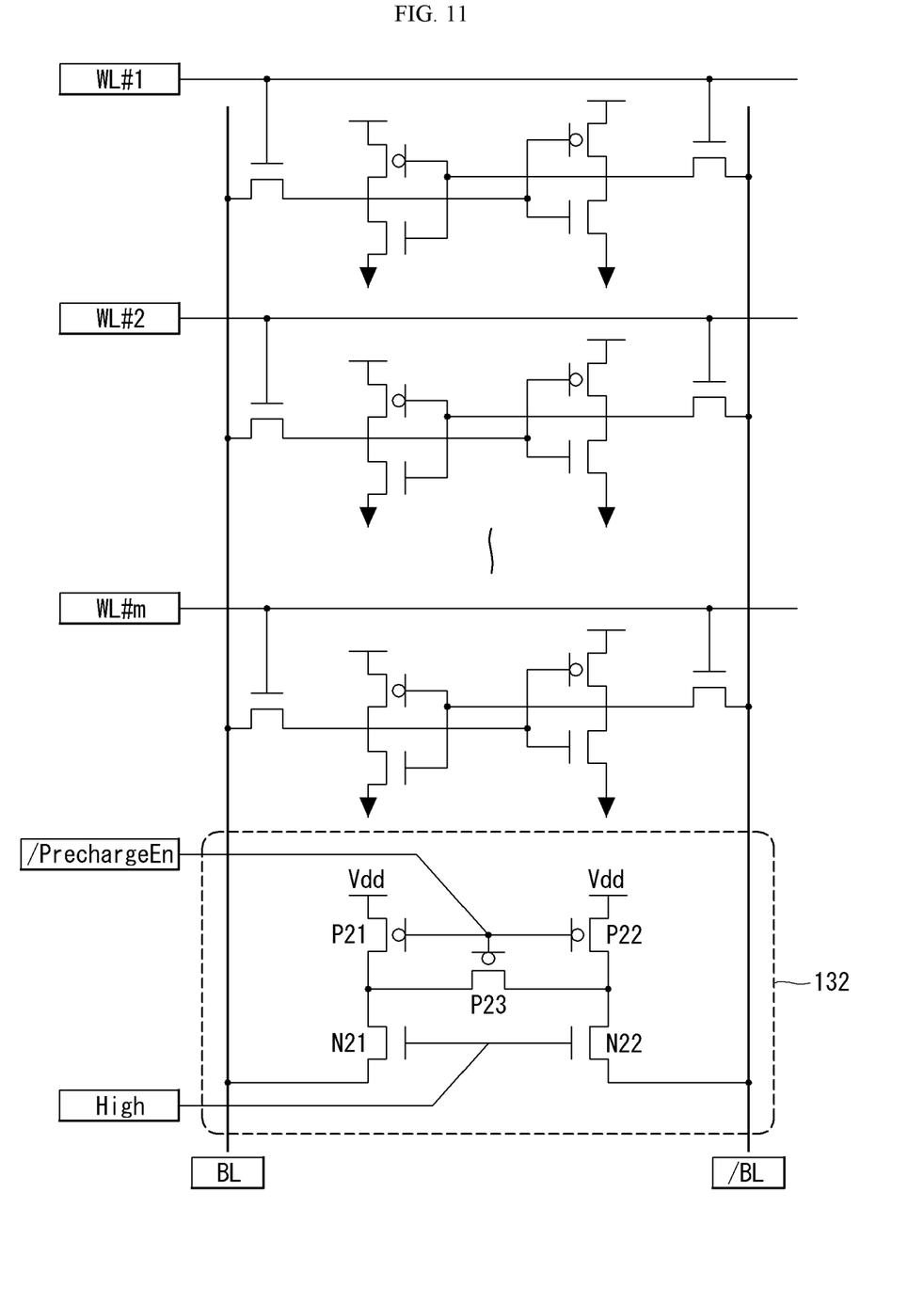
FIG. 11 shows a precharging circuit according to an embodiment of this disclosure.

FIG. 11 shows a precharging circuit according to an embodiment of this disclosure and adjusts the precharging level to precharge the bit line pair.

The precharging level may be set equal to the first power supply voltage Vdd. However, it is not easy to simultaneously charge a large number of the bit lines BL and inverted bit lines /BL, whose potentials are lowered to the second power supply voltage by developing, to the first power supply voltage during a short word line off period.

The embodiment of this disclosure may not precharge the bit line and the inverted bit line developed to the second power supply voltage to the first power supply voltage Vdd, but precharge to a voltage lower than the first power supply voltage Vdd, without precharging.

The precharging circuit to charge the bit line pair to the precharging voltage lower than the first power supply voltage according to the embodiment of this disclosure may be configured by respectively connecting two NMOS transistors in series to the conventional precharging circuit consisting of three PMOS transistors, as shown in FIG. 11.

While a PMOS transistor is advantageous for passing a high voltage without a voltage drop in a turn-on state, an NMOS transistor is advantageous for passing a low voltage without a voltage drop in the turn-on state. However, even when a high voltage is input to a first electrode in the turn-on state, the NMOS transistor cannot output the input high voltage to a second electrode as it is, but outputs a voltage lower than the input voltage.

The embodiment of this disclosure can lower the precharging level with a simple circuit structure by using the characteristics of the PMOS transistor and the NMOS transistor.

The conventional precharging circuit for precharging the bit line pair to the first power supply voltage Vdd comprises fourth and fifth PMOS transistors P21 and P22 and a sixth PMOS transistor P23. The fourth and fifth PMOS transistors P21 and P22 have gate electrodes which are connected to a second signal line supplying a precharging control signal /PrechargeEn, and first electrodes which are connected to the first power supply voltage Vdd. The sixth PMOS transistor P23 has a gate electrode which is connected the second signal line and first and second electrodes which are respectively connected to one and the other of second electrodes of the fourth and fifth PMOS transistors P21 and P22.

The sixth PMOS transistor P23 performs an equalizing function for matching the potentials of the bit line BL and the inverted bit line /BL.

The precharging control signal /PrechargeEn outputs a logic low level during the period when the word line is off to turn on the fourth/fifth/sixth PMOS transistors (P21/P22/P23), which makes the second electrodes of the fourth/fifth PMOS transistors P21/P22 output the first power voltage Vdd.

A first NMOS transistor N21 and a second NMOS transistor N22 generate a precharging voltage at a level lower than the first power voltage Vdd and output the precharging voltage to the bit line BL and the inverted bit line /BL.

In the first NMOS transistor N21, a gate electrode is connected to logic high, a first electrode is connected to the second electrode of the fourth PMOS transistor P21, and a second electrode is connected to the bit line BL.

In the second NMOS transistor N22, a gate electrode is connected to logic high, a first electrode is connected to the second electrode of the fifth PMOS transistor P22, and a second electrode is connected to the inverted bit line /BL.

In the precharging circuit 132 of FIG. 11, the fourth/fifth PMOS transistors P21/P22 may be omitted, and the first/second electrodes of the sixth PMOS transistor P23 may be respectively connected to the bit lines BL and the inverted bit line /BL. In this case, the first/second NMOS transistors N12/N22 may be controlled by the control signal having a logic opposite to that of the precharging control signal /PrechargeEn.

Even though the bit line and the inverted bit line are charged to a voltage level lower than the first power voltage Vdd by a precharging operation during the off period of the word line, one of the bit line and the inverted bit line constituting the bit line pair is developed with the first power supply voltage Vdd corresponding to data bit 1, and the other is developed with the second power supply voltage corresponding to data bit 0, during the develop time of the word line on period, so there is nothing wrong with developing the bit line pair.

Figure 12:
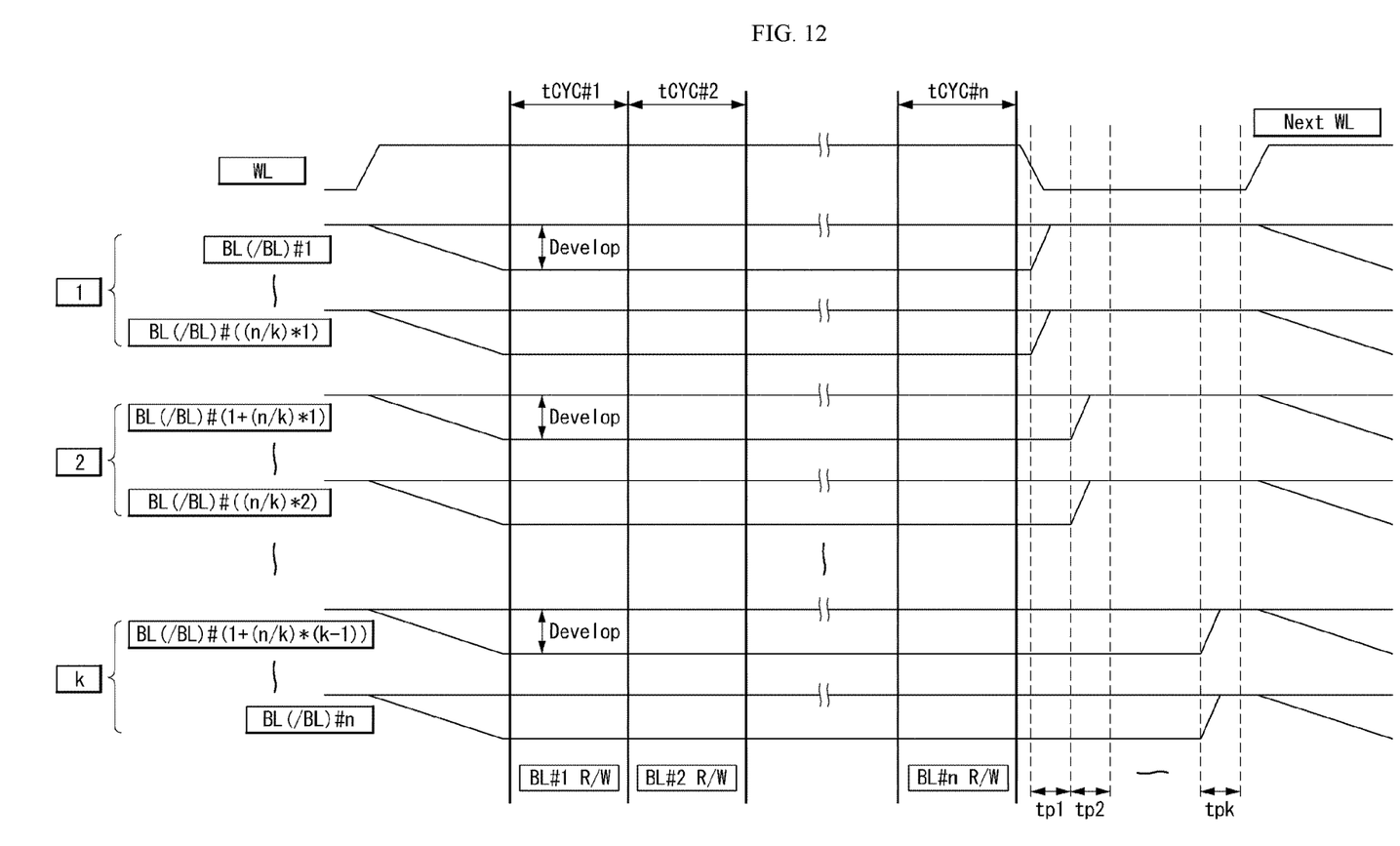
FIG. 12 is a diagram illustrating that precharging operations are performed step by step while delaying the precharging operations in a group unit composed of a predetermined number of bit line pairs according to another embodiment of this disclosure.

FIG. 12 is a diagram illustrating that precharging operations are performed step by step while delaying the precharging operations in a group unit composed of a predetermined number of bit line pairs according to another embodiment of this disclosure.

If the number of bit line pairs corresponding to a page and an input/output unit must be precharged at the same time, supply of current may become a problem.

The embodiment of this disclosure may divide n bit line pairs related to a page for which data writing/reading is requested into k groups, and sequentially precharge the bit line pairs at different timings in a group unit during the period in which the word line becomes off.

In FIG. 12, the first group of n/k bit line pairs BL #1 to BL #((n/k)*1) may be precharged in a first precharging period tp1, the second group of n/k bit line pairs BL #(1+(n/k)*1) to BL #((n/k)*2) may be precharged in a second precharging period tp2, and the kth group of n/k bit line pairs BL #(1+(n/k)*(k−1)) to BL #n may be precharged in a kth precharging period tpk.

The operation of distributing the precharging period for each group may be performed based on the control signal supplied by the control circuit 140, or may be performed based on the control signal generated by the input/output circuit 130 based on the timing signal supplied by the control circuit 140.

The distributed precharging operation of FIG. 12 may be performed using the conventional precharging circuit composed of three PMOS transistors and connected to each bit line pair, or may be performed using the precharging circuit according to the embodiment of this disclosure described with reference to FIG. 11.

According to the embodiment shown in FIG. 12, the bit line pairs are not precharged at the same time, but are precharged in a time-distributed manner, thereby smoothly supplying current without increasing the current supply capacity.

As described above, in order to program or read a plurality of memory cells, while not switching on/off the word line as many as the number of memory cells, but by switching on/off the word line only once, switching and a plurality of memory cells are switched only by on/off switching of the word line once. program or read, the effect of reducing the number of precharging times of the bit lines, reducing power consumption, and increasing the data input/output speed may be obtained.

The memory device and the memory driving method according to this disclosure may be applied to the display unit (the memory of the timing controller or the data driver IC of the display unit) of the mobile device that is sensitive to power consumption and is primarily intended for continuous reading or writing of data, and may obtain advantageous effects can be obtained are sensitive to power consumption and mainly include a display unit (a timing controller or data driver IC of a display unit) of a mobile device whose purpose is to continuously read or write data. of memory) to obtain a favorable effect.

INDUSTRIAL APPLICABILITY

Hereinabove, the preferred embodiments of the present disclosure are disclosed for an illustrative purpose and hereinafter, modifications, changes, substitutions, or additions of various other embodiments will be made within the technical spirit and the technical scope of the present disclosure disclosed in the appended claims by those skilled in the art.

The invention claimed is:

1. A memory device, comprising:
a memory cell array in which memory cells of a latch structure are connected in a matrix form to word lines and bit line pairs each of which comprises a bit line and an inverted bit line; and
a driving circuit configured to sequentially program or read n second memory cells among first memory cells connected to a word line through n first bit line pairs (n is a natural number equal to or greater than 2) during an on period in which the word line activates the first memory cells,
wherein the driving circuit comprises a precharging circuit to charge the bit line and the inverted bit line of a corresponding bit line pair through 2 NMOS transistors during an off period inactivating the first memory cells with a second voltage lower than a supply voltage supplied to the memory cells,
wherein the precharging circuit comprises first and second PMOS transistors, a third PMOS transistor, and first and second NMOS transistors,
wherein in the first and second PMOS transistors, input electrodes receive the supply voltage, and control electrodes are connected to each other and receive a turn-on logic level during the off period,
wherein in the third PMOS transistor, a control electrode is connected to the control electrode of the first PMOS transistor, and input and output electrodes are respectively connected to one and the other of output electrodes of first and second PMOS transistors, and
wherein in the first and second NMOS transistors, input electrodes are respectively connected to one and the other of the input and output electrodes of the third PMOS transistor, control electrodes receive the turn-on logic level during the off period, and output electrodes are respectively connected to one and the other of the bit line and the inverted bit line.

2. The memory device of claim 1, wherein the on period comprises a first period during which the first bit line pairs are developed, and n second periods during which the second memory cells are sequentially programmed or read after the first period.

3. The memory device of claim 2, wherein the driving circuit comprises a compensation circuit connected to the bit line and the inverted bit line of each of the first bit line pairs, in order to maintain voltage levels of the bit line and the inverted bit line of each of the first bit line pairs during the n second periods.

4. The memory device of claim 3, wherein the compensation circuit comprises fourth to sixth PMOS transistors,
wherein during the n second periods the fourth PMOS transistor outputs a first supply voltage same as a supply voltage supplied to the memory cells, and
wherein in each of the fifth and sixth PMOS transistors, an input electrode is connected to an output electrode of the fourth PMOS transistor, a control electrode and an output electrode are respectively connected to the bit line and the inverted bit line or the inverted bit line and the bit line.

5. The memory device of claim 2, wherein the driving circuit divides the n first bit line pairs into k groups and precharges the n first bit line pairs in a group unit, while precharging respective groups at different timings during an off period inactivating the n first memory cells.

* * * * *